US011121676B1

(12) United States Patent
Ba

(10) Patent No.: US 11,121,676 B1
(45) Date of Patent: Sep. 14, 2021

(54) METHODS AND CIRCUITS FOR HARMONIC SUPPRESSION

(71) Applicant: Dialog Semiconductor B.V., 's-Hertogenbosch (NL)

(72) Inventor: Ao Ba, Maarssen (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 44 days.

(21) Appl. No.: 16/596,358

(22) Filed: Oct. 8, 2019

(51) Int. Cl.
| | |
|---|---|
| *H03F 1/00* | (2006.01) |
| *H03F 1/02* | (2006.01) |
| *H03H 7/01* | (2006.01) |
| *H03F 1/56* | (2006.01) |
| *H03F 3/195* | (2006.01) |

(52) U.S. Cl.
CPC ......... *H03F 1/0233* (2013.01); *H03H 7/0115* (2013.01); *H03F 1/565* (2013.01); *H03F 3/195* (2013.01); *H03F 2200/165* (2013.01); *H03F 2200/451* (2013.01); *H03F 2200/541* (2013.01)

(58) Field of Classification Search
CPC ............. H03F 1/0233; H03F 2200/451; H03F 2200/165; H03F 2200/541; H03F 2203/45228; H03F 1/347; H03F 2203/45731; H03F 3/217; H03F 3/2171; H03F 3/2173; H03F 2200/432; H03F 3/2176; H03F 2200/351; H03F 1/0244; H03F 1/0211; H03F 2200/504; H03F 1/0227; H03F 1/305; H03F 3/04; H03F 2200/507; H03H 7/0115

USPC ................ 330/165, 171, 195, 197, 276, 297
See application file for complete search history.

(56) References Cited

U.S. PATENT DOCUMENTS

| | | | | |
|---|---|---|---|---|
| 8,909,162 | B2* | 12/2014 | Ilkov ........................ | H03F 3/187 455/73 |
| 9,438,170 | B2* | 9/2016 | Jin ........................ | H03F 3/45269 |
| 10,062,947 | B2* | 8/2018 | Huang .................... | H03F 3/245 |

OTHER PUBLICATIONS

"A 28 GHz Inverse Class-F Power Amplifier with Coupled-Inductor based Harmonic Impedance Modulator," by Seyed Yahya Mortazavi et al., 2015 IEEE Custom Integrated Circuits Conference (CICC), Sep. 28-30, 2015, 4 pages.

(Continued)

*Primary Examiner* — Khanh V Nguyen
(74) *Attorney, Agent, or Firm* — Saile Ackerman LLC; Stephen B. Ackerman

(57) ABSTRACT

The present document discloses circuits and methods for providing an output voltage at an output port. In one of the embodiments, a circuit has a power amplifier having an output. In particular, the circuit may have a first transformer including a first coil and a second coil. Moreover, the circuit may have a first capacitor connected in parallel to the first coil and a second capacitor connected in parallel to the second coil. More particularly, the circuit may be adapted to have a first end of the first coil connected to the output of the power amplifier, and a second end of the first coil connected to the output port of the circuit.

30 Claims, 9 Drawing Sheets

(56) References Cited

OTHER PUBLICATIONS

"An Integrated 700-1200-MHz Class-F PA With Tunable Harmonic Terminations in 0.13-μm CMOS," by Kossi K. Sessou et al., IEEE Transactions on Microwave Theory and Techniques, vol. 63, No. 4, Apr. 2015, pp. 1315-1323.

"A Class-F CMOS Oscilllator," by Masoud Babaie et al., IEEE Joural of Solid-State Circuits, vol. 48, No. 12, Dec. 2013. pp. 3120-3133.

"A 0.2V Energy-Harvesting BLE Transmitter with a Micropower Manager Achieving 25% System Efficiency at 0dBm Output and 5.2nW Sleep Power in 28nm CMOS," by Jun Yin et al., 2018 IEEE International Solid-State Circuits Conference—(ISSCC), Feb. 11-15, 2018, pp. 450-452.

\* cited by examiner

METHODS AND CIRCUITS FOR HARMONIC SUPPRESSION

TECHNICAL FIELD

This disclosure relates to harmonic suppression, in particular to applying harmonic suppression to the output of a power amplifier, such as for example a switching-mode power amplifier.

BACKGROUND

Recently, systems have been developed for harmonic suppression in electronic devices, in particular where switching circuits produce undesired harmonics at frequencies different from the fundamental frequency of a desired circuit output.

For example, switching-mode power amplifiers like the class-D and class-F power amplifiers 100, 200 shown in FIGS. 1 and 2, respectively, allow amplification with high energy efficiency which is particularly useful for Bluetooth and other wireless applications. For this purpose, as shown in FIGS. 1 and 2, LC resonators 110, 210 are conventionally arranged at the outputs of the power amplifiers 100, 200 to resonate at the fundamental frequency of the class-D power amplifier 100 or at two harmonic frequencies of the class-F power amplifier 200. This allows suppressing undesired harmonics by notch filtering which would otherwise leak from the power amplifiers 100, 200, more specifically from the drains of the power amplifier transistors shown in FIGS. 1 and 2.

It follows that the LC resonators 110, 210 shown in FIGS. 1 and 2 can reduce undesired harmonics, but such a circuit design generally results in a bulk and lossy Silicon arrangement, in particular because of physical characteristics of the inductor L forming part of the LC resonators 110, 210.

Jun Yin, et al., "A 0.2V Energy-Harvesting BLE Transmitter with a Micropower Manager Achieving 25% System Efficiency at 0 dBm Output and 5.2 nW Sleep Power in 28 nm CMOS", ISSCC 2018, proposes to embed the harmonic notch filter (LC resonator) into a main transformer to suppress the 3rd harmonic without additional Silicon area.

This particular article proposes to implement the embedded notch filter as a part of the main transformer, i.e. by insertion into the middle of the respective secondary coil. Unfortunately, this kind of implementation has limited harmonic suppression performance, as unwanted harmonics can leak from the primary coil to the secondary coil on the half side that is connected to the output. Moreover, in this arrangement, the notch filter can only resonate at a single frequency, for example to suppress only the 3rd harmonic at the output.

The flexibility and performance of notch filtering can be improved by increasing the number of passive components on the silicon area. However, increasing the number of passive components, for example to sufficiently suppress unwanted harmonics emission as required by local regulations, also increases the Silicon area occupied by these components, the related manufacturing cost, and the overall complexity and reliability of circuit design.

SUMMARY

In view of some or all of the above problems, the present disclosure proposes circuits and methods for providing an output voltage at an output port, having the features of the respective independent claims.

An aspect of the disclosure relates to a circuit for providing an output voltage at an output port. The circuit comprises a power amplifier having an output. The power amplifier may be adapted to amplify signals in an electronic device, for example in a device including transmitter and/or receiver modules, such as for example radio, Bluetooth and/or wireless communication units. In an example, the electronic device may represent a mobile device, for example a handheld device providing an user interface, such as for example a mobile communication device.

According to this aspect of the disclosure, the circuit further comprises a first transformer including a first coil (e.g., first inductor) and a second coil (e.g., second inductor). In this respect, the first coil and the second coil are arranged such as to represent magnetically coupled coils, for example coils which are magnetically or inductively coupled by a coupling factor k.

The circuit also includes a first capacitor connected in parallel to the first coil, and a second capacitor connected in parallel to the second coil. A first end of the first coil is connected to the output of the power amplifier, and the second end of the first coil is connected to the output port of the circuit.

Accordingly, the first transformer has two coils L1, L2 which together with two capacitors C1, C2 can be selected to form a filter having a desired transfer function in the frequency domain.

In some embodiments, the first coil L1, second coil L2, first capacitor C1 and second capacitor C2 are configured such that a signal provided at the output port of the circuit corresponds to a notch filtered version of the signal provided at the output of the power amplifier. For example, if the two coils L1, L2 are magnetically coupled by a coupling factor k, the transfer function of the filter can be defined to suppress two selected harmonic frequencies $\omega_{1,2}$ at the output of the power amplifier. In an example, the following formula can be used for determining the resulting harmonic frequencies $\omega_{1,2}$ at which the output of the power amplifier is suppressed:

$$\omega_{1,2}^2 = \frac{1 + \left(\frac{L_2 C_2}{L_1 C_1}\right) \pm \sqrt{1 + \left(\frac{L_2 C_2}{L_1 C_1}\right)^2 + \left(\frac{L_2 C_2}{L_1 C_1}\right)(4k^2 - 2)}}{2 L_2 C_2 (1 - k^2)} \quad \text{Eq. 1}$$

Hence, the circuit can be configured to form a notch filter for suppressing two harmonics of the signal provided at the output of the power amplifier. Alternatively, as will be appreciated by the skilled person, the circuit can be configured to form a filter for matching a load connected to the output port of the circuit.

In some embodiments, the power amplifier comprises a second transformer having a first coil (e.g., first inductor) and a second coil (e.g., second inductor). In this case, a first end of the first coil of the second transformer is connected to the output of the power amplifier. In an example, the second transformer of the power amplifier can be adapted to form the power amplifier as a differential switching-mode power amplifier. For example, the ends of the second coil of the second transformer can be coupled to two different switching MOSFET amplifier units, respectively, for example via two capacitors connected in series between the MOSFET amplifier units and ends of the second coil of the second transformer. In this way, the second transformer can be configured to provide at the power amplifier output, a signal corresponding to a differential switching-mode power amplifier mode, wherein each of the MOSFET amplifier units amplifies a different input signal.

In some embodiments, the power amplifier is configured to form a differential switching-mode power amplifier and/or a power amplifier of a Bluetooth Low Energy device. Differential switching-mode power amplifiers can be efficiently used in Bluetooth Low Energy devices, for example because of their high energy efficiency.

In some embodiments, the first and second coils of the first transformer and the first and second coils of the second transformer are formed as spiral inductors. In an example, the spiral inductors can be formed by laying out a conductive trace in a spiral pattern, for example by etching a spiral conductive strip on a printed circuit board or by forming a microstrip spiral inductor, for example in a monolithic type semiconductor processing. As will be understood and appreciated by the skilled person, various designs can be adopted for implementing the spiral inductors.

In some embodiments, the spiral inductors forming the first and second coils of the first transformer are positioned inside the spiral inductors forming the first and second coils of the second transformer. In alternative embodiments, the spiral inductors forming the first and second coils of the second transformer are positioned inside the spiral inductors forming the first and second coils of the first transformer.

In some embodiments, the first and second coils of the first transformer are arranged in an interleaving manner, such that conductive segments of the second coil are interposed between conductive segments of the first coil, and vice-versa. Similarly, the first and second coils of the second transformer can be arranged in an interleaving manner, such that conductive segments of the second coil are interposed between conductive segments of the first coil, and vice-versa.

For example, in said embodiments wherein the spiral inductors forming the first and second coils of the first transformer are positioned inside the spiral inductors forming the first and second coils of the second transformer, the spiral inductor forming the second coil of the first transformer can be positioned inside the spiral inductor forming the first coil of the first transformer, whereas the spiral inductors forming the first and second coils of the second transformer can be arranged in an interleaving manner.

In some embodiments, the spiral inductors are formed on the same surface as on-chip planar microstrip spiral inductors. In some other embodiments, the spiral inductors are formed in a multi-layer manner, i.e. as planar microstrip spiral inductors disposed on different layers of the chip.

Another aspect of the disclosure relates to a circuit for providing an output voltage at an output port. The circuit comprises a power amplifier with a transformer, wherein the transformer comprises a first and a second transformer coil. The power amplifier may be adapted to amplify signals in an electronic device, for example in a device including transmitter and/or receiver modules, such as for example radio, Bluetooth and/or wireless communication units. In an example, the electronic device may represent a mobile device, for example a handheld device providing an user interface, such as for example a mobile communication device.

According to this aspect of the disclosure, the circuit further comprises a first coil (e.g., first inductor) and a second coil (e.g., second inductor), and a capacitor connected by one end to the first end of the first coil. Further, a first end of the first coil is connected to a second end of the second coil, and a first end of the first transformer coil is connected to a second end of the first coil. The first end of the second coil represents the output port of the circuit.

Moreover, the first transformer coil and the first coil are configured to be inductively coupled by a first coupling factor k1, and the first transformer coil and the second coil are configured to be inductively coupled by a second coupling factor k2. In other words, the arrangement of the first transformer coil relative to the first and second coils is selected such that the first transformer coil is magnetically coupled with the first and second coils.

Accordingly, the first transformer coil, the first and second coil and the capacitor can be selected to form a filter having a desired transfer function in the frequency domain.

In some embodiments, the first coil, second coil and capacitor are configured such as to generate a signal at the output port of the circuit corresponding to a notch filtered version of the signal provided at the first end of the first transformer coil, for example to suppress a harmonic of the signal provided at the first end of the first transformer coil, or to match a load connected to the output port of the circuit.

In some embodiments, the transformer of the power amplifier is adapted to form the power amplifier as a differential switching-mode power amplifier. For example, the ends of the second transformer coil can be coupled to two different switching MOSFET amplifier units, respectively, for example via two capacitors connected in series between the MOSFET amplifier units and ends of the second coil of the transformer. In this way, the transformer can be configured to output at the first end of the first transformer coil a signal corresponding to a differential switching-mode power amplifier, wherein each of the MOSFET amplifier units amplifies a different input signal.

In some embodiments, the power amplifier is configured to form a differential switching-mode power amplifier and/or a power amplifier of a Bluetooth Low Energy device. Differential switching-mode power amplifiers can be efficiently used in Bluetooth Low Energy devices, for example because of their high energy efficiency.

In some embodiments, the first and second transformer coils and the first and second coils are formed as spiral inductors. In an example, the spiral inductors can be formed by laying out a conductive trace in a spiral pattern, for example by etching a spiral conductive strip on a printed circuit board or by forming a microstrip spiral inductor, for example in a monolithic type semiconductor processing. As will be understood and appreciated by the skilled person, various designs can be adopted for implementing the spiral inductors.

In some embodiments, the spiral inductors forming the first and second transformer coils are arranged in an interleaving manner, such that conductive segments of the second transformer coil are interposed between conductive segments of the first transformer coil, and vice-versa. Alternatively, the spiral inductor forming the first coil of the transformer can be positioned inside the spiral inductor forming the second coil of the transformer, or the spiral inductor forming the second coil of the transformer can be positioned inside the spiral inductor forming the first coil of the transformer.

In some embodiments, the spiral inductors forming the first and second coils are positioned inside the spiral inductors forming the first and second transformer coils. In other words, the spiral inductors forming the first and second transformer coils are arranged to surround or encompass the spiral inductors forming the first and second coils, such that the first transformer coil is inductively coupled to the first coil and also to the second coil. In this case, in some embodiments, the spiral inductors forming the first and second coils are positioned adjacently and are connected in series inside the spiral inductors forming the first and second transformer coils. Thus, the spiral inductors forming the first and second transformer coils are arranged to surround or encompass a series circuit of spiral inductors forming the first and second coils.

In some embodiments, the spiral inductors are formed on the same surface as on-chip planar microstrip spiral inductors. In some other embodiments, the spiral inductors are formed in a multi-layer manner, i.e. as planar microstrip spiral inductors disposed on different layers of the chip.

An aspect of the disclosure relates to a method for providing an output voltage at an output port. The method comprises providing a power amplifier having an output. The power amplifier may be adapted to amplify signals in an electronic device, for example in a device including transmitter and/or receiver modules, such as for example radio, Bluetooth and/or wireless communication units. In an example, the electronic device may represent a mobile device, for example a handheld device providing a user interface, such as for example a mobile communication device.

The method further comprises providing a first transformer including a first coil (e.g., first inductor) and a second coil (e.g., second inductor). In this respect, the first coil and the second coil are arranged such as represent magnetically coupled coils, for example coils which are magnetically coupled by a coupling factor k.

The method further comprises providing a first capacitor and connecting the first capacitor in parallel to the first coil, and providing a second capacitor and connecting the second capacitor in parallel to the second coil.

Moreover, the method comprises connecting a first end of the first coil to the output of the power amplifier, and connecting a second end of the first coil to the output port of the circuit, such as to generate a signal at the output port of the circuit corresponding to a filtered version of the signal provided at the output of the power amplifier.

Accordingly, the first transformer has two coils which together with two capacitors can be selected to form a filter having a desired transfer function in the frequency domain.

In some embodiments, the first coil, second coil, first capacitor and second capacitor are configured such that said signal generated at the output port of the circuit corresponds to a notch filtered version of the signal provided at the output of the power amplifier. For example, if the first coil and the second coil are magnetically coupled by a coupling factor k, the transfer function of the filter can be defined two suppress two selected harmonic frequencies $\omega_{1,2}$ at the output of the power amplifier. In an example, the above formula Eq. 1 can be used for determining the resulting harmonic frequencies $\omega_{1,2}$ at which the output of the power amplifier is suppressed.

In some embodiments, the method comprises notch filtering said signal provided at the output of the power amplifier such as to suppress two harmonics, or to match a load connected to the output port of the circuit.

In some embodiments, the power amplifier comprises a second transformer having a first and a second coil (e.g., second inductor). In this case the method can comprise connecting a first end of the first coil of the second transformer to the output of the power amplifier. In an example, the second transformer of the power amplifier can be adapted to form the power amplifier as a differential switching-mode power amplifier. For example, the ends of the second coil of the second transformer can be coupled to two different switching MOSFET amplifier units, respectively, for example via two capacitors connected in series between the MOSFET amplifier units and ends of the second coil of the second transformer. In this way, the second transformer can be configured to provide at the power amplifier output a signal corresponding to differential switching-mode power amplifier, wherein each of the MOSFET amplifier units amplifies a different input signal. In some embodiments, the power amplifier is configured to provide a differential switching-mode power amplifier and/or a power amplifier of a Bluetooth Low Energy device. Differential switching-mode power amplifiers can be efficiently used in Bluetooth Low Energy devices, for example because of their high energy efficiency.

In some embodiments, the method comprises forming the first and second coils of the first transformer and the first and second coils of the second transformer as spiral inductors. In an example, the spiral inductors can be formed by laying out a conductive trace in a spiral pattern, for example by etching a spiral conductive strip on a printed circuit board or by forming a microstrip spiral inductor, for example in a monolithic type semiconductor processing. As will be understood and appreciated by the skilled person, various designs can be adopted for forming the spiral inductors.

In some embodiments, the method includes forming the spiral inductors representing the first and second coils of the first transformer such as to be positioned inside the spiral inductors representing the first and second coils of the second transformer. In alternative embodiments, the spiral inductors representing the first and second coils of the second transformer are formed to be positioned inside the spiral inductors representing the first and second coils of the first transformer.

In some embodiments, the first and second coils of the first transformer are formed such that the second coil of the first transformer is positioned inside the spiral inductor representing the first coil of the first transformer. Similarly, in some embodiments, the first and second coils of the second transformer can be formed such that the second coil of the second transformer is positioned inside the spiral inductor representing the first coil of the second transformer.

In some embodiments, the first and second coils of the first transformer are formed in an interleaving manner, such that conductive segments of the second coil are interposed between conductive segments of the first coil, and vice-versa. Similarly, the first and second coils of the second transformer can be formed in an interleaving manner, such that conductive segments of the second coil are interposed between conductive segments of the first coil, and vice-versa.

For example, in said embodiments wherein the spiral inductors representing the first and second coils of the first transformer are formed to be positioned inside the spiral inductors representing the first and second coils of the second transformer, the spiral inductor representing the second coil of the first transformer can be formed to be positioned inside the spiral inductor representing the first coil of the first transformer, whereas the spiral inductors representing the first and second coils of the second transformer can be formed in an interleaving manner.

In some embodiments, the spiral inductors are formed on the same surface as on-chip planar microstrip spiral inductors. In some other embodiments, the spiral inductors are formed in a multi-layer manner, i.e. as planar microstrip spiral inductors disposed on different layers of the chip.

Another aspect of the disclosure relates to a method for providing an output voltage at an output port, the method comprising providing a power amplifier with a transformer, wherein the transformer comprises a first and a second transformer coil. The power amplifier may be adapted to amplify signals in an electronic device, for example in a device including transmitter and/or receiver modules, such as for example radio, Bluetooth and/or wireless communication units. In an example, the electronic device may represent a mobile device, for example a handheld device providing a user interface, such as for example a mobile communication device.

According to this aspect of the disclosure, the method comprises: providing a first coil (e.g., first inductor) and a second coil (e.g., second inductor) and connecting a first end of the first coil to a second end of the second coil, connecting a first end of the first transformer coil to a second end of the first coil, and connecting a first end of the second coil to the output port of the circuit.

The method further comprises providing a capacitor and connecting said capacitor by one end to the first end of the first coil.

Moreover, the method comprises configuring the first transformer coil and the first coil to be inductively coupled by a first coupling factor k1, and configuring the first transformer coil and the second coil to be inductively coupled by a second coupling factor k2, such that a signal generated at the output port of the circuit corresponds to a filtered version of the signal provided at the first end of the first transformer coil.

Accordingly, the first transformer coil, the first and second coil and the capacitor can be configured to form a filter having a desired transfer function in the frequency domain.

In some embodiments, the method comprises configuring the first coil, second coil and capacitor such as to generate a signal at the output port of the circuit corresponding to a notch filtered version of the signal provided at the first end of the first transformer coil, for example to suppress a harmonic of the signal provided at the first end of the first transformer coil, or to match a load connected to the output port of the circuit.

In some embodiments, providing the power amplifier includes providing a differential switching-mode power amplifier, or providing a differential switching-mode power amplifier of a Bluetooth Low Energy device. For example, in some embodiments, the transformer of the power amplifier can be provided to form the power amplifier as a differential switching-mode power amplifier. For example, the ends of the second transformer coil of the can be coupled to two different switching MOSFET amplifier units, respectively, for example via two capacitors connected in series between the MOSFET amplifier units and ends of the second coil of the transformer. In this way, the transformer can be configured to output at the first end of the first transformer coil a signal corresponding to a differential switching-mode power amplifier, wherein each of the MOSFET amplifier units amplifies a different input signal.

In some embodiments, the power amplifier is provided to form a differential switching-mode power amplifier and/or a power amplifier of a Bluetooth Low Energy device. Differential switching-mode power amplifiers can be efficiently used in Bluetooth Low Energy devices, for example because of their high energy efficiency.

In some embodiments, the first and second transformer coils and the first and second coils are formed as spiral inductors. In an example, the spiral inductors can be formed by laying out a conductive trace in a spiral pattern, for example by etching a spiral conductive strip on a printed circuit board or by forming a microstrip spiral inductor, for example in a monolithic type semiconductor processing. As will be understood and appreciated by the skilled person, various designs can be adopted for implementing the spiral inductors.

In some embodiments, the spiral inductors representing the first and second transformer coils are formed in an interleaving manner, such that conductive segments of the second transformer coil are interposed between conductive segments of the first transformer coil, and vice-versa. Alternatively, the spiral inductor representing the first coil of the transformer can be formed to be positioned inside the spiral inductor representing the second coil of the transformer, or the spiral inductor representing the second coil of the transformer can be formed to be positioned inside the spiral inductor forming the first coil of the transformer.

In some embodiments, the spiral inductors representing the first and second coils are formed to be positioned inside the spiral inductors representing the first and second transformer coils. In other words, the spiral inductors forming the first and second transformer coils are arranged to surround or encompass the spiral inductors forming the first and second coils, such that the first transformer coil is inductively coupled to the first coil and also to the second coil. In this case, in some embodiments, the spiral inductors representing the first and second coils are formed to be positioned adjacently and are connected in series inside the spiral inductors representing the first and second transformer coils. Thus, the spiral inductors forming the first and second transformer coils are arranged to surround or encompass a series circuit of spiral inductors forming the first and second coils.

In some embodiments, the spiral inductors are formed on the same surface as on-chip planar microstrip spiral inductors. In some other embodiments, the spiral inductors are formed in a multi-layer manner, i.e. as planar microstrip spiral inductors disposed on different layers of the chip.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates a prior-art circuit arrangement of a Class-D power amplifier including a filter for suppressing a harmonic.

DESCRIPTION

Identical or like reference numbers in the disclosure indicate identical or like elements, and repeated description thereof may be omitted for reasons of conciseness. Any power amplifier devices mentioned in this disclosure may include semiconductor elements, such as for example BJTs, MOSFETs, or other types of field effect transistors.

Figure 1:
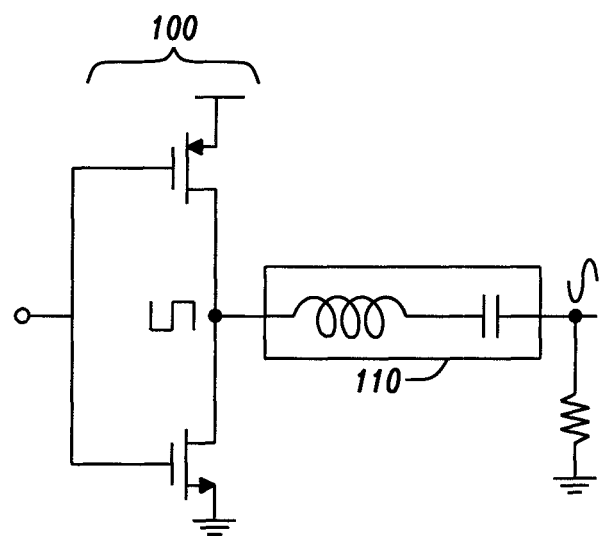
Figure 2:
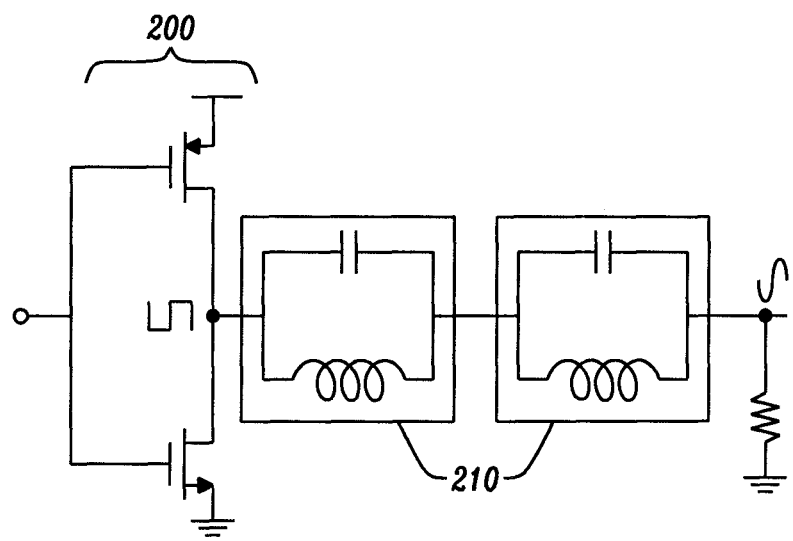
FIG. 2 schematically illustrates a prior-art circuit arrangement of a Class-F power amplifier including a filter for suppressing two harmonics.
Figure 3:
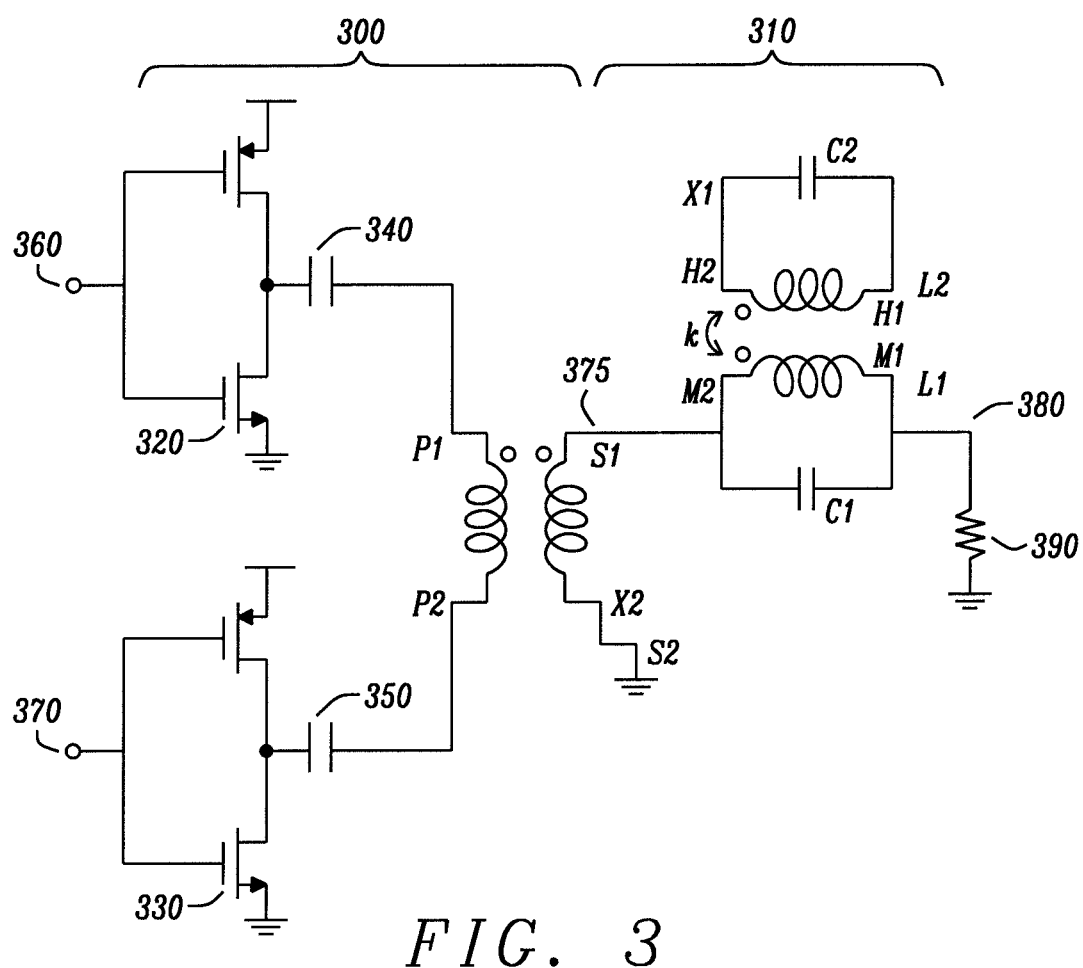
FIG. 3 schematically illustrates a circuit arrangement of a power amplifier including a filter for suppressing two harmonics according to an embodiment of the present disclosure.

FIG. 3 schematically illustrates an example of a circuit including a power amplifier 300 connected to a filter 310 which has been adapted for harmonics suppression in accordance with an embodiment of the present disclosure.

In the example shown in FIG. 3, the power amplifier 300 represents a differential switching-mode power amplifier which is adapted to provide differential-to-single mode conversion, as will be appreciated by the skilled person in the art. More specifically, as shown in FIG. 3, a transformer X2 of the power amplifier 300 is arranged to form a differential switching-mode power amplifier, wherein ends of a primary side coil of the transformer X2 are coupled to two switching MOSFET amplifier units 320, 330, respectively, via two capacitors 340, 350. Here, the two capacitors 340, 350 are connected in series between the MOSFET amplifier units 320, 330 and the ends of the primary side coil of the transformer X2. In this way, one end of the secondary side of the transformer X2 provides a power amplifier output signal 380 corresponding to the differential switching-mode, i.e. wherein each of the MOSFET amplifier units 340, 350 amplifies the respective different input signal 360, 370. In the example shown in FIG. 3, the other end of the secondary side coil of the transformer X2 is connected to ground. However, as will be appreciated by the person skilled in the art, any other reference voltage can be used.

The circuit 300, 310 shown in FIG. 3 may be adapted to amplify signals in an electronic device, for example in a device including transmitter and/or receiver modules, such as for example radio, Bluetooth and/or wireless communication units. In an example, the electronic device may represent a mobile device, for example a handheld device providing a user interface, such as for example a mobile communication device.

The filter 310 of the circuit further comprises a transformer X1 having a first and a second coil (e.g., first and second inductors) L1, L2.

In the following, for ease of reference, the transformer X1 of the filter 310 is referred to as the first transformer X1, the transformer X2 of the power amplifier is referred to as the second transformer X2 and the secondary side coil of the second transformer X2 is referred to as the first coil of the second transformer X2.

Hence, as shown in FIG. 3, the filter 310 of the circuit comprises a first transformer X1 including a first coil (e.g., first inductor) L1 and a second coil (e.g., second inductor) L2. The first coil L1 and the second coil L2 are arranged such as to represent magnetically coupled coils, i.e. coils which are magnetically coupled by a coupling factor k.

The filter 310 of the circuit also includes a first capacitor C1 connected in parallel to the first coil L1, and a second capacitor C2 connected in parallel to the second coil L2. A first end of the first coil L1 is connected to the output 375 of the power amplifier 300, and the second end of the first coil L1 is connected to the output port 380 of the circuit. In this example, the output port 380 of the circuit is shown to be connected to a load resistance 390, however, as will be appreciated by the skilled person in the art, any impedance or connection can be used depending on the underlying application.

Thus, the first transformer X1 has two coils L1, L2 which together with the two capacitors C1, C2 can be selected to form a filter 310 having a desired transfer function in the frequency domain.

Figure 4:
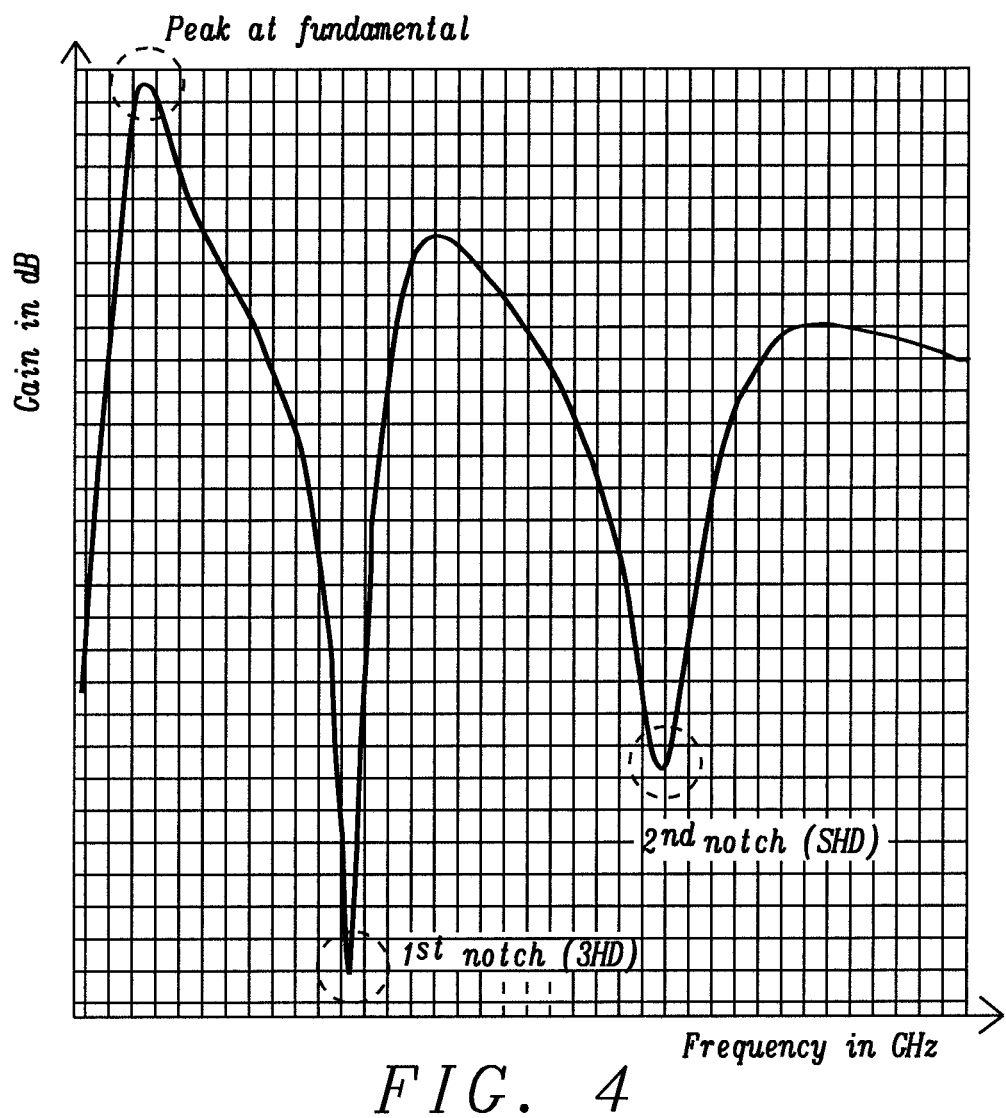
FIG. 4 shows an example of a frequency response of the notch filter shown in FIG. 3 according to an embodiment of the present disclosure.

In the embodiment shown in FIG. 3, the first coil L1, second coil L2, first capacitor C1 and second capacitor C2 are configured such that a signal provided at the output port 380 of the circuit corresponds to a notch filtered version of the signal provided at the output 375 of the power amplifier 300. For this purpose, in this example, the above equation Eq. 1 has been used to have the filter 310 suppress two selected harmonic frequencies $\omega_{1,2}$ at the output 375 of the power amplifier 300. In this way, the two resonating frequencies are set to desired values, corresponding to Eq. 1, such that the filter 310 has two notches as shown in FIG. 4. In FIG. 4, the notches have been selected to suppress the 3rd and 5th harmonics of the signal being output 375 by the power amplifier 300. In a different example, as will be appreciated by the skilled person, the circuit can be configured to form a filter 310 for matching the load 390 connected to the output port 380 of the circuit 300, 310.

Accordingly, the filter 310 is tuned to stimulatingly resonate at two desired frequencies $\omega_{1,2}$ such as to suppress undesired harmonics at the output 375 of the power amplifier 300. For this purpose, the transformers X1, X2 can represent separate components of the circuit 300, 310 or can be embedded as a plurality of spiral inductors.

Figure 5:
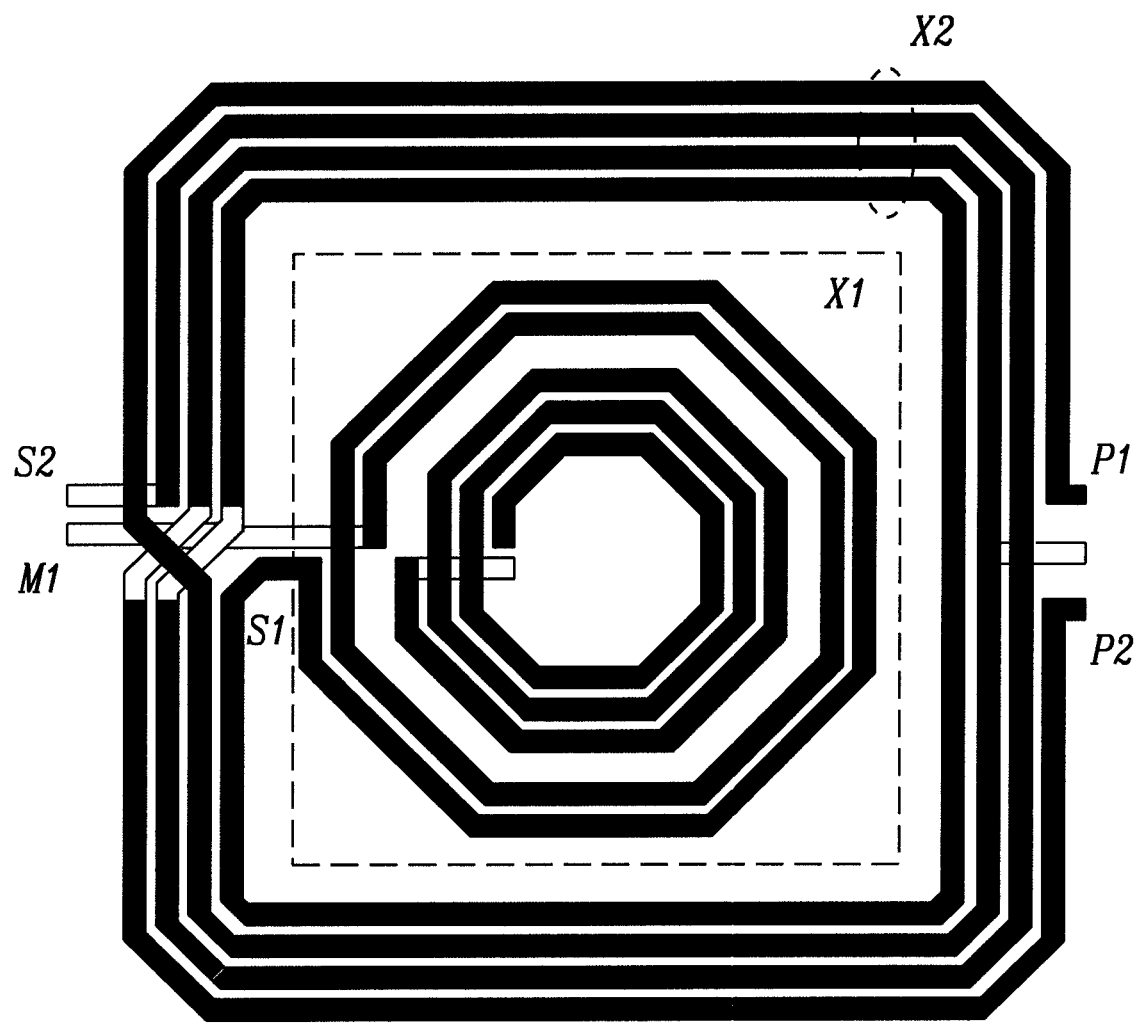
FIG. 5 shows inductors of the circuit of a power amplifier shown in FIG. 3 being formed as spiral inductors according to an embodiment of the present invention.

More specifically, as shown in FIG. 5, the first and second coils of the first transformer X1 and the first and second coils of the second transformer X2 can be formed as spiral inductors. In this example, the spiral inductors are formed as microstrip spiral inductors in a monolithic type semiconductor processing. However, as will be understood and appreciated by the skilled person, various designs can be adopted for implementing the spiral inductors. For example, in a different example, the spiral inductors can be formed in a multi-layer manner, i.e. as planar microstrip spiral inductors disposed on different layers of a Silicon chip. The latter arrangement simplifies the electrical connection of different elements by allowing conductive traces to overlap in different layers in an electrically insulated manner.

In the arrangement shown in FIG. 5, the spiral inductors forming the first and second coils of the first transformer X1 are positioned inside the spiral inductors forming the first and second coils of the second transformer X2. In alternative embodiments, the spiral inductors forming the first and second coils of the second transformer X2 can be positioned inside the spiral inductors forming the first and second coils of the first transformer X1.

In the arrangement shown in FIG. 5, the first and second coils of the second transformer X2 are arranged in an interleaving manner, such that conductive segments of the second coil are interposed between conductive segments of the first coil, and vice-versa. Moreover, the first and second coils of the first transformer X1 are shown to be arranged in a non-overlapping manner, such that conductive segments of one coil of the first transformer X1 is disposed inside the other coil of the first transformer X1. This arrangement provides a compact filter having efficient magnetic coupling characteristics. However, alternatively, the inner transformer X1 could be formed in an interleaving manner and/or the outer transformer X2 could be formed in a non-overlapping manner.

In any case, forming the respective inductors as spiral inductors provides a compact and efficient arrangement for implementing the circuit shown in FIG. 3, allowing to suppress two harmonics of the signal generated by the power amplifier 300. Further, the efficiency of the switching-mode power amplifier is improved. More specifically, since the filter 310 is adapted to block the 3rd and 5th harmonics, less energy is wasted at the high harmonic frequencies. It also follows that as the drain voltage of the power amplifier 300 MOSFETS is closer to an ideal square waveform and the respective drain current is closer to an ideal sinusoid waveform as shown at the circuit output 280 in FIG. 3. Thus, the energy loss due to the drain voltage/current overlapping is reduced.

Figure 6:
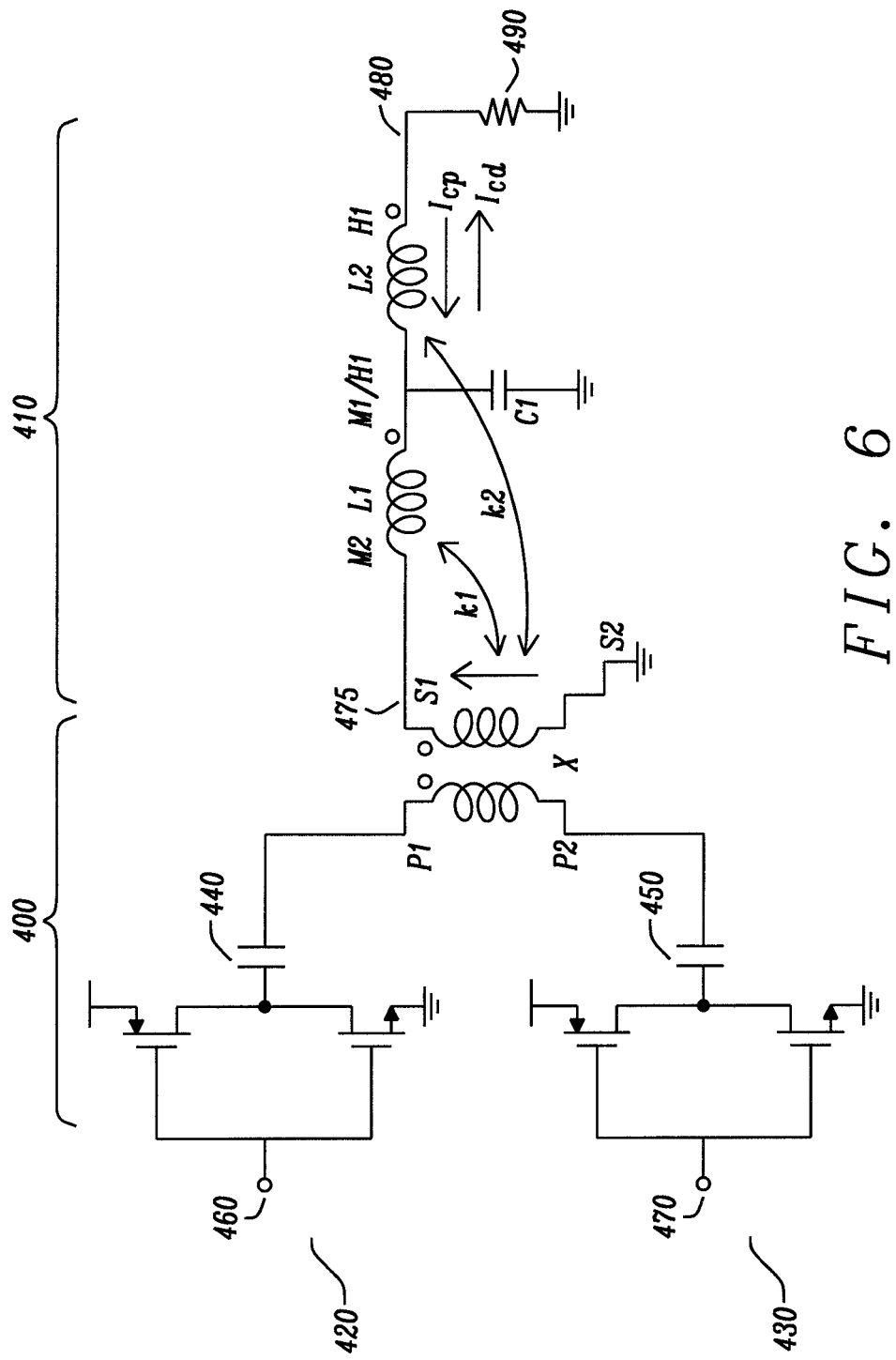
FIG. 6 schematically illustrates a circuit arrangement of a power amplifier including a filter for suppressing a harmonic according to an embodiment of the present disclosure.

FIG. 6 schematically illustrates an example of a circuit including a power amplifier 400 connected to a filter 410 for harmonics suppression in accordance with an embodiment of the present disclosure.

In the example shown in FIG. 6, the power amplifier 400 represents a differential switching-mode power amplifier allowing differential-to-single mode conversion, as will be appreciated by the person skilled in the art. More specifically, as shown in FIG. 6, a transformer X of the power amplifier 400 is arranged to form a differential switching-mode power amplifier, wherein the ends of a primary side coil of the transformer X are coupled to two different switching MOSFET amplifier units 420, 430, respectively, via two capacitors 440, 450. Thus, the two capacitors 440, 450 are connected in series between the MOSFET amplifier units 420, 430 and ends of the primary side coil of the transformer X. In this way, one end of the secondary side coil of the transformer X provides a power amplifier output signal 475 corresponding to a differential switching-mode, wherein each of the MOSFET amplifier units 440, 450 amplifies a different input signal 460, 470. In the example shown in FIG. 6, the other end of the secondary side coil of the transformer X is connected to ground. However, as will be appreciated by the skilled person in the art, any other reference voltage can be used.

The circuit 400, 410 shown in FIG. 6 may be adapted to amplify signals in an electronic device, for example in a device including transmitter and/or receiver modules, such as for example radio, Bluetooth and/or wireless communication units. In an example, the electronic device may represent a mobile device, for example a handheld device providing a user interface, such as for example a mobile communication device.

The filter 410 of the circuit further comprises a first coil (e.g., first inductor) L1 and a second coil (e.g., second inductor) L2, and a capacitor C1 connected by one end to the first end of the first coil L1. The first end of the first coil L1 is also connected to a second end of the second coil L2, and a first end of the secondary side coil of the transformer X is connected to a second end of the first coil L1. The first end of the second coil L2 represents the output port 480 of the circuit 400, 410. In this example, the output port 480 of the circuit is shown to be connected to a load resistance 490, however, as will be appreciated by the skilled person in the art, any other connection or impedance can be used depending on the underlying application.

In the following, for ease of reference, the secondary side coil of the transformer X is referred to as the first transformer coil, and the primary side coil of the transformer X is referred to as the second transformer coil.

As shown in FIG. 6, the first transformer coil and the first coil L1 are configured to be inductively coupled by a first coupling factor k1, and the first transformer coil and the second coil L2 are configured to be inductively coupled by a second coupling factor k2. In other words, the arrangement of the first transformer coil relative to the first and second coils L1, L2 is selected such that the first transformer coil is magnetically coupled with the first and second coils L1, L2.

Accordingly, in the arrangement shown in FIG. 6, the first transformer coil, the first and second coil L1, L2 and the capacitor C1 can be selected to form a filter 410 having a desired transfer function in the frequency domain.

Figure 7:
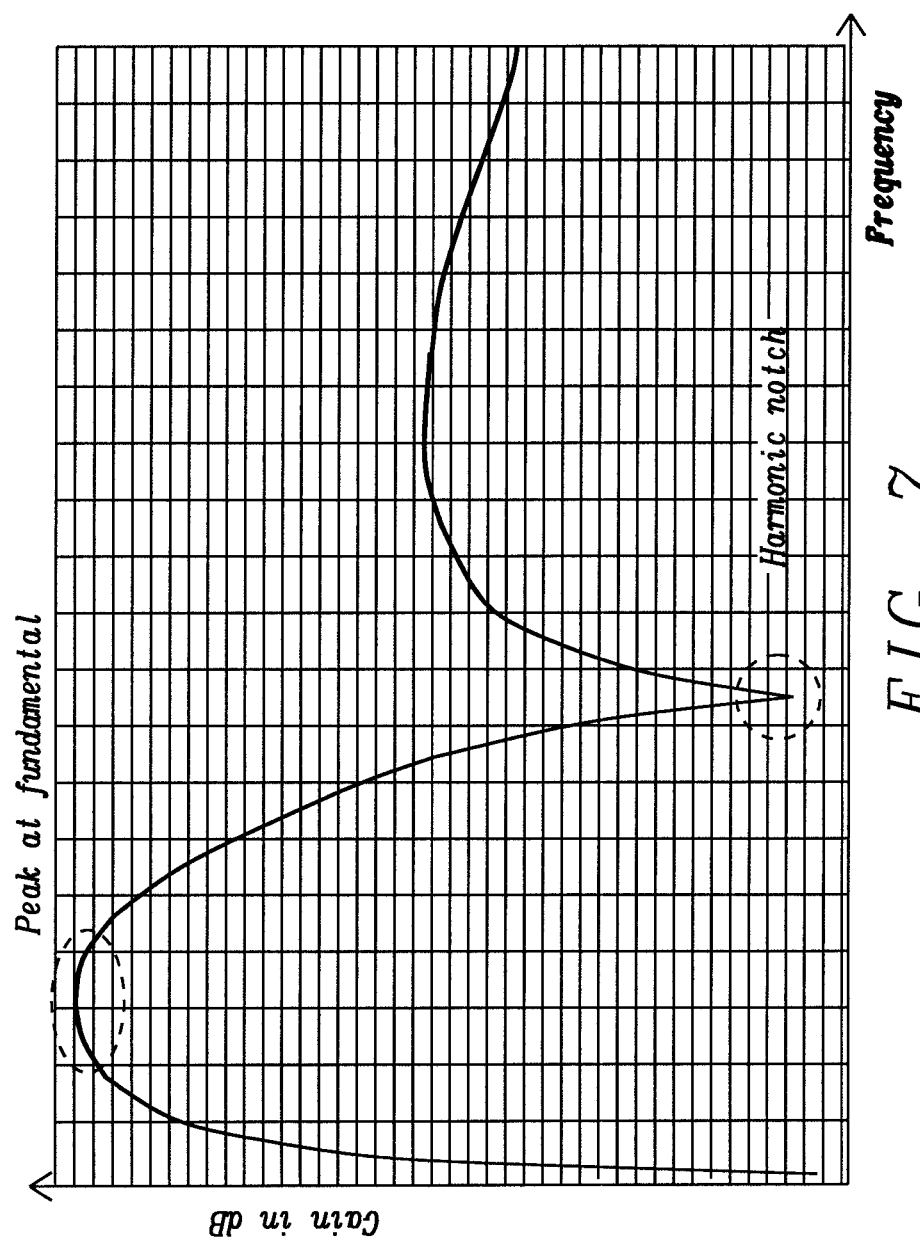
FIG. 7 shows an example of a frequency response of the notch filter shown in FIG. 6 according to an embodiment of the present disclosure.

In the example shown in FIG. 6, the first coil L1, second coil L2 and capacitor C1 are configured such as to generate a signal at the output port 480 of the circuit corresponding to a notch filtered version of the signal S1 provided at the first end 475 of the first transformer coil L1. In this way, the filter 410 is configured to suppress a desired harmonic of the signal provided at the first end 475 of the first transformer coil. This is shown in FIG. 7, wherein the notch has been selected to suppress a harmonic of the signal being output 475 by the power amplifier 400, wherein the output signal 475 has a fundamental frequency represented by a peak in the pass-band region of the filter 410. In a different example, as will be appreciated by the skilled person, the circuit can be configured to form a filter 410 for matching the load 490 connected to the output port 480 of the circuit 400, 410.

Thus, the filter 410 is tuned to stimulatingly resonate at a desired frequency such as to suppress an undesired harmonic at the output 475 of the power amplifier 400.

Figure 8:
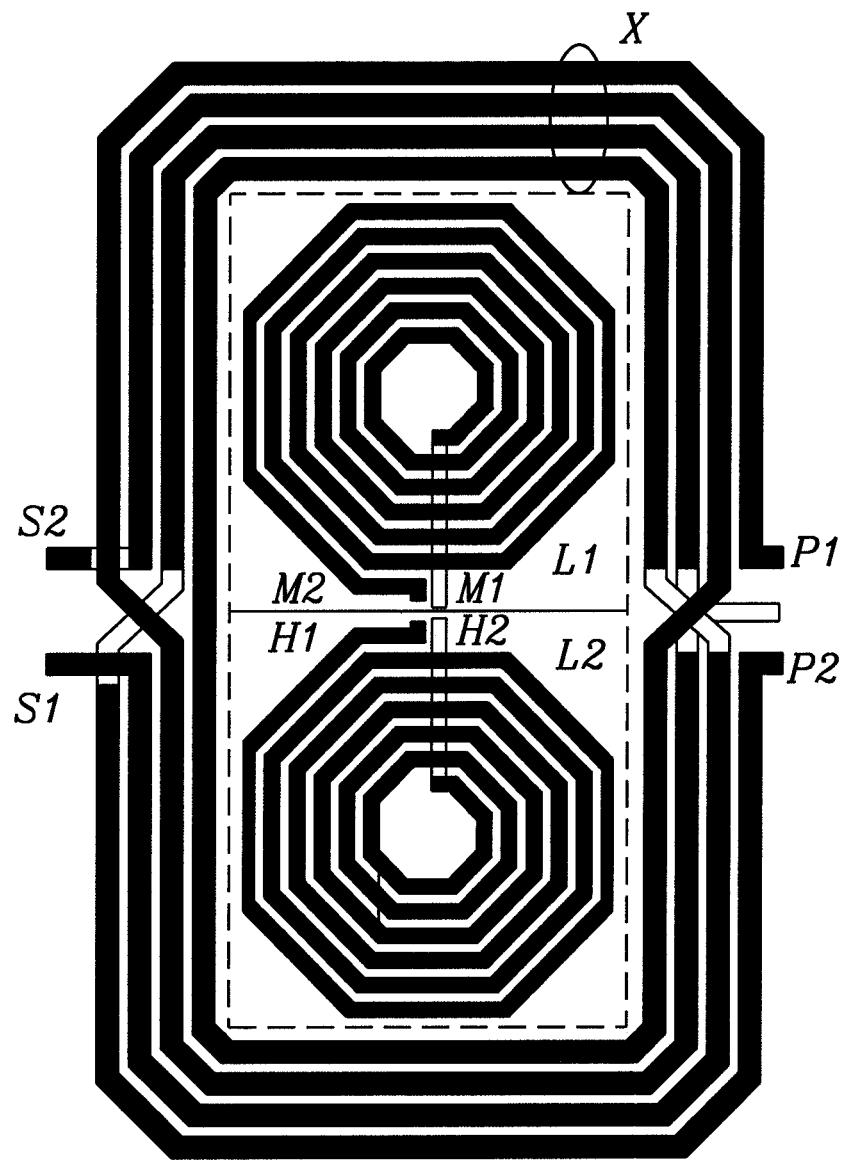
FIG. 8 shows inductors of the circuit of a power amplifier shown in FIG. 6 being formed as spiral inductors according to an embodiment of the present invention.

In an example, the transformer X and the first and second coils L1, L2 can represent separate components of the circuit 400, 410 or can be embedded to form a plurality of spiral inductors. More specifically, as shown in FIG. 8, the first and second coils of the transformer X and the first and second coils L1, L2 of the filter 410 can be formed as spiral inductors. In this example, the spiral inductors are formed by forming microstrip spiral inductors in a monolithic type semiconductor processing. However, as will be understood and appreciated by the skilled person, various designs can be adopted for implementing the spiral inductors. For example, in a different example, the spiral inductors can be formed in a multi-layer manner, i.e. as planar microstrip spiral inductors disposed on different layers of a Silicon chip. The latter arrangement simplifies the electrical connection of different elements by allowing conductive traces to overlap in different layers in an electrically insulated manner.

In the example shown in FIG. 8, the spiral inductors forming the first and second coils of the transformer X are positioned outside the spiral inductors forming the first and second coils L1, L2 of the filter 410.

In the arrangement shown in FIG. 8, the spiral inductors forming the first and second coils of the transformer X are arranged in an interleaving manner, such that conductive segments of the second coil of the transformer X are interposed between conductive segments of the first coil of the transformer X, and vice-versa. Alternatively, the spiral inductor forming the first coil of the transformer X can be positioned inside the spiral inductor forming the second coil of the transformer X, or the spiral inductor forming the second coil of the transformer X can be positioned inside the spiral inductor forming the first coil of the transformer X.

As shown in FIG. 8, the spiral inductors forming the first and second coils L1, L2 are positioned inside the spiral inductors forming the first and second coils of the transformer X. In other words, the spiral inductors forming the first and second coils X are arranged to surround or encompass the spiral inductors forming the first and second coils L1, L2, such that the first coil of the transformer X is inductively coupled to the first coil L1 and also to the second coil L2.

In the example shown in FIG. 8, the spiral inductors forming the first and second coils L1, L2 are positioned adjacently and are connected in series inside the spiral inductors forming the first and second coils of the transformer X. Thus, the spiral inductors forming the first and second coils of the transformer X are arranged to surround or encompass a series circuit of spiral inductors forming the first and second coils L1, L2.

Forming the spiral inductors in this manner provides a very compact and efficient arrangement for implementing the circuit shown in FIG. 6. The filter 410 shown in FIG. 6 can be regarded as representing a pi-shape low-pass filter coupled to the transformer X. By proper design, i.e. by determining the inductors L1, L2, capacitor C1 and coupling factors k1 and k2, the coupling current from X to L2 is compensated by the conducted current in L2 at a certain frequency. This feature is shown in FIG. 7 to allow creating a notch to filter out a particular power amplifier harmonic. Thus, although only one notch is created, the low-pass profile for other high-frequency harmonics is well maintained.

In this example, the selection of the inductors L1, L2, capacitor C1 and coupling factors k1 and k2 was performed by simulating the circuit shown in FIG. 6 for different respective constellations. Alternatively, the selection of the inductors L1, L2, capacitor C1 and coupling factors k1 and k2 can be performed by solving model equations describing the current and voltage behavior at nodes of the circuit shown in FIG. 6.

Further, by embedding the two inductors L1 and L2 into the rectangle defined by the transformer X, as shown in FIG. 8, a compact arrangement of components allows building up the respective mutual inductive couplings k1 and k2 in an efficient manner.

Figure 9:
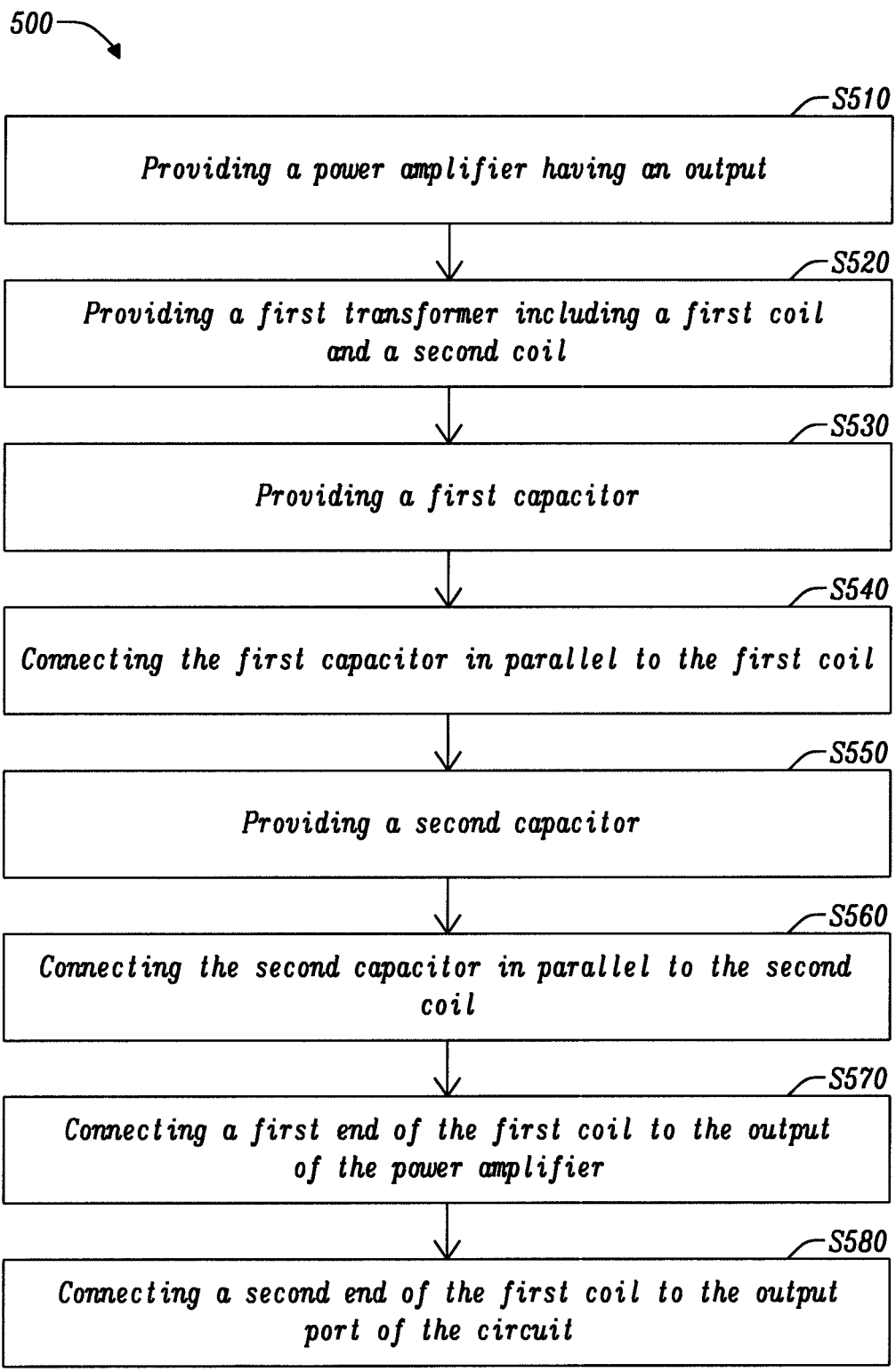
FIG. 9 shows in flowchart form, a first method for providing an output voltage at an output port, according to an embodiment of the present invention.

FIG. 9 schematically illustrates, in flowchart form, a first method 500 for providing an output voltage at an output port, corresponding to components of the circuit 300, 310 shown in FIG. 3 being provided for the same purpose. Therefore, repeated description for the second method 500 is omitted for reasons of conciseness. In particular, as shown in FIG. 9, the first method 500 comprises the steps of:
- providing a power amplifier having an output S510;
- providing a first transformer including a first coil (e.g., first inductor) and a second coil (e.g., second inductor) S520;
- providing a first capacitor S530;
- connecting the first capacitor in parallel to the first coil S540;
- providing a second capacitor S550;
- connecting the second capacitor in parallel to the second coil S560;
- connecting a first end of the first coil to the output of the power amplifier S570; and
- connecting a second end of the first coil to the output port of the circuit, such as to generate a signal at the output port of the circuit corresponding to a filtered version of the signal provided at the output of the power amplifier S580.

Figure 10:
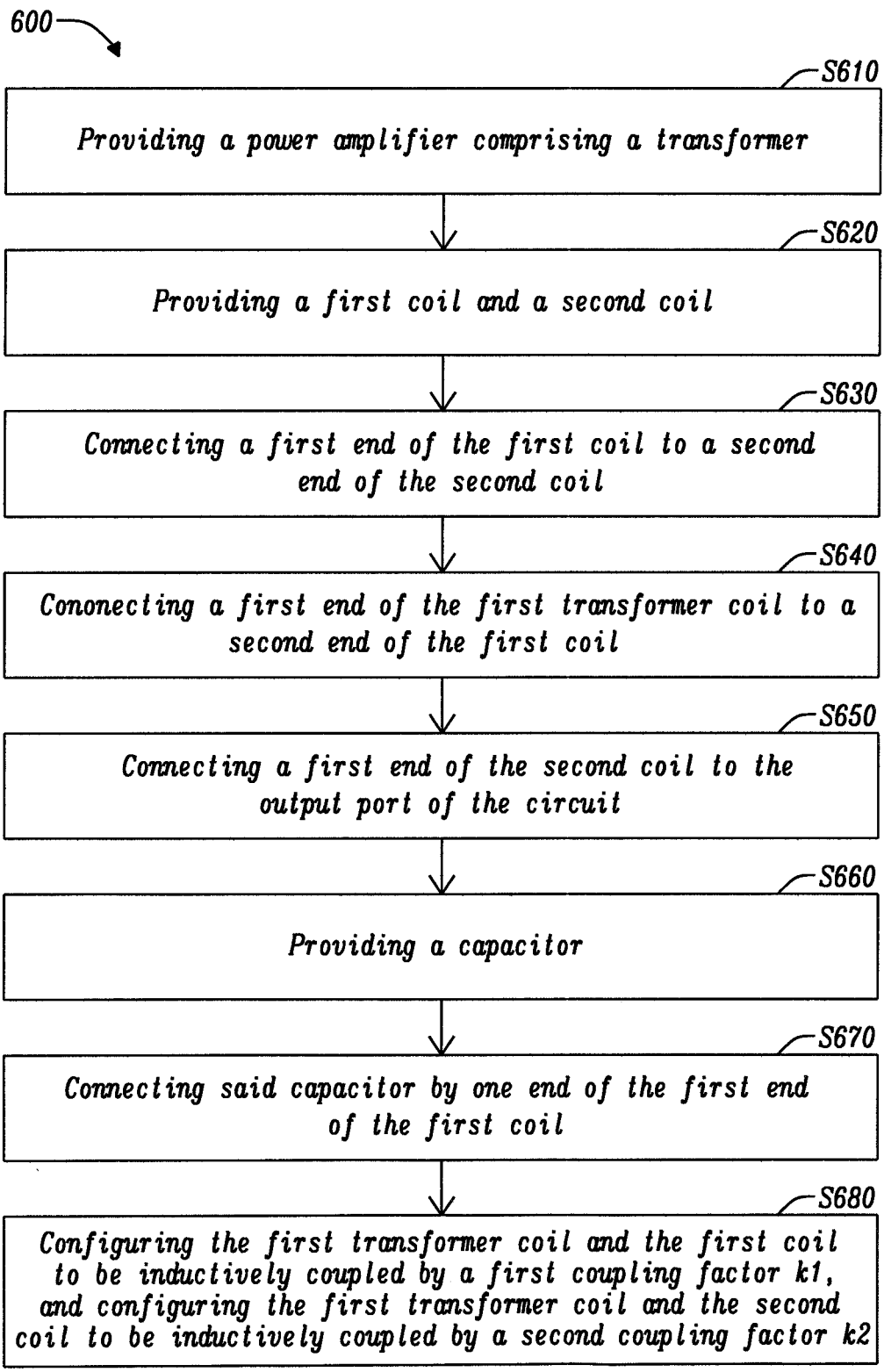
FIG. 10 shows in flowchart form, a second method for providing an output voltage at an output port, according to an embodiment of the present invention.

FIG. 10 schematically illustrates, in flowchart form, a second method 600 for providing an output voltage at an output port, corresponding to components of the circuit 400, 410 shown in FIG. 6 being provided for the same purpose. Therefore, repeated description for the second method 600 is omitted for reasons of conciseness. In particular, as shown in FIG. 9, the second method 600 comprises the steps of:
- providing a power amplifier comprising a transformer S610, wherein the transformer comprises a first and a second transformer coil;
- providing a first coil (e.g., first inductor) and a second coil (e.g., second inductor) S620;
- connecting a first end of the first coil to a second end of the second coil S630;
- connecting a first end of the first transformer coil to a second end of the first coil S640;
- connecting a first end of the second coil to the output port of the circuit S650;
- providing a capacitor S660;
- connecting said capacitor by one end to the first end of the first coil S670;
- configuring the first transformer coil and the first coil to be inductively coupled by a first coupling factor k1, and configuring the first transformer coil and the second coil to be inductively coupled by a second coupling factor k2, such that a signal generated at the output port of the circuit corresponds to a filtered version of the signal provided at the first end of the first transformer coil S680.

It should be noted that the apparatus (circuitry) features described above correspond to respective method features that may however not be explicitly described, for reasons of conciseness. The disclosure of the present document is considered to extend also to such method features. In particular, the present disclosure is understood to relate to methods of providing the circuits described above, and/or to providing and/or arranging respective elements of theses circuits.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A circuit for providing an output voltage at an output port,
the circuit comprising:
a power amplifier having an output;
a first transformer including a first coil and a second coil;
a first capacitor connected in parallel to the first coil; and
a second capacitor connected in parallel to the second coil;
wherein a first end of the first coil is connected to the output of the power amplifier, and wherein a second end of the first coil is connected to the output port of the circuit, wherein the first coil, second coil, first capacitor and second capacitor are configured such that a signal provided at the output port of the circuit corresponds to a notch filtered version of a signal provided at the output of the power amplifier,
and wherein said notch filtering is adapted to suppress two harmonics of the signal provided at the output of the power amplifier.

2. The circuit according to claim 1, wherein the power amplifier comprises a second transformer having a first and a second coil, wherein a first end of the first coil of the second transformer is connected to the output of the power amplifier.

3. The circuit according to claim 2, wherein the power amplifier is a differential switching-mode power amplifier and/or a power amplifier of a Bluetooth Low Energy device.

4. The circuit according to claim 2, wherein the first and second coils of the first transformer and the first and second coils of the second transformer are formed as spiral inductors.

5. The circuit according to claim 4, wherein the spiral inductors forming the first and second coils of the first transformer are positioned inside the spiral inductors forming the first and second coils of the second transformer.

6. The circuit according to claim 5, wherein the spiral inductor forming the second coil of the first transformer is positioned inside the spiral inductor forming the first coil of the first transformer.

7. The circuit according to claim 4, wherein said spiral inductors are formed on the same surface as on-chip planar microstrip spiral inductors.

8. A circuit for providing an output voltage at an output port, the circuit comprising:
a power amplifier comprising a transformer, wherein the transformer comprises a first and a second transformer coil;
a first coil and a second coil; and
a capacitor connected by one end to a first end of the first coil;
wherein: the first end of the first coil is connected to a second end of the second coil, a first end of the second coil is the output port of the circuit, a first end of the first transformer coil is connected to a second end of the first coil, and
wherein the first transformer coil and the first coil are configured to be inductively coupled by a first coupling factor, and wherein the first transformer coil and the second coil are configured to be inductively coupled by a second coupling factor.

9. The circuit according to claim 8, wherein the first coil, second coil and capacitor are configured such as to generate a signal at the output port of the circuit corresponding to a notch filtered version of a signal provided at the first end of the first transformer coil.

10. The circuit according to claim 9, wherein said notch filtering is adapted to suppress a harmonic of the signal provided at the first end of the first transformer coil, or match a load connected to the output port of the circuit.

11. The circuit according to claim 8, wherein the power amplifier is a differential switching-mode power amplifier, or wherein the power amplifier is a differential switching-mode power amplifier of a Bluetooth Low Energy device.

12. The circuit according to claim 8, wherein the first and second transformer coils and the first and second coils are formed as spiral inductors.

13. The circuit according to claim 12, wherein the spiral inductors forming the first and second coils are positioned inside the spiral inductors forming the first and second transformer coils.

14. The circuit according to claim 13, wherein the spiral inductors forming the first and second coils are positioned adjacently and are connected in series inside the spiral inductors forming the first and second transformer coils.

15. The circuit according to claim 12, wherein said spiral inductors are formed on the same surface as on-chip planar microstrip spiral inductors.

16. A method for providing an output voltage at an output port, the method comprising:
providing a power amplifier having an output;
providing a first transformer including a first coil and a second coil;
providing a first capacitor;
connecting the first capacitor in parallel to the first coil;
providing a second capacitor;
connecting the second capacitor in parallel to the second coil;
connecting a first end of the first coil to the output of the power amplifier;
connecting a second end of the first coil to the output port, such as to generate a signal at the output port corresponding to a filtered version of a signal provided at the output of the power amplifier;
configuring the first coil, second first capacitor and second capacitor such that said signal generated at the output port corresponds to a notch filtered version of the signal provided at the output of the power amplifier; and
notch filtering said signal provided at the output of the power amplifier such as to suppress two harmonics.

17. The method according to claim 16, wherein the power amplifier comprises a second transformer having a first and a second coil, the method comprising connecting a first end of the first coil of the second transformer to the output of the power amplifier.

18. The method according to claim 17, wherein providing the power amplifier includes providing a differential switching-mode power amplifier, and/or providing a power amplifier of a Bluetooth Low Energy device.

19. The method according to claim 17, further comprising forming the first and second coils of the first transformer and the first and second coils of the second transformer as spiral inductors.

20. The method according to claim 19, wherein forming the first and second coils of the first transformer as spiral inductors includes arranging the first and second coils of the first transformer inside the spiral inductors forming the first and second coils of the second transformer.

21. The method according to claim 20, wherein forming the second coil of the first transformer as a spiral inductor includes arranging the second coil inside the spiral inductor forming the first coil of the first transformer.

22. The method according to claim 19, wherein forming said spiral inductors includes forming the spiral inductors on the same surface as on-chip planar microstrip spiral inductors.

23. A method for providing an output voltage at an output port, the method comprising:
providing a power amplifier comprising a transformer, wherein the transformer comprises a first and a second transformer coil;
providing a first coil and a second coil;
connecting a first end of the first coil to a second end of the second coil;
connecting a first end of the first transformer coil to a second end of the first coil;
connecting a first end of the second coil to the output port;
providing a capacitor;

connecting said capacitor by one end to the first end of the first coil;

configuring the first transformer coil and the first coil to be inductively coupled by a first coupling factor, and configuring the first transformer coil and the second coil to be inductively coupled by a second coupling factor, such that a signal provided at the output port corresponds to a filtered version of a signal provided at the first end of the first transformer coil.

24. The method according to claim 23, further comprising configuring the first coil, second coil and capacitor such that the signal provided at the output port corresponds to a notch filtered version of the signal provided at the first end of the first transformer coil.

25. The method according to claim 24, comprising:

notch filtering the signal provided at the first end of the first transformer coil to suppress a harmonic of the signal, or to match a load connected to the output port.

26. The method according to claim 23, wherein providing the power amplifier includes providing a differential switching-mode power amplifier or providing a differential switching-mode power amplifier of a Bluetooth Low Energy device.

27. The method according to claim 23, comprising forming the first and second transformer coils and the first and second coils as spiral inductors.

28. The method according to claim 27, wherein forming the first and second coils as spiral inductors includes arranging the first and second coils inside the spiral inductors forming the first and second transformer coils.

29. The method according to claim 28, wherein forming the first and second coils as spiral inductors includes arranging the first and second coils adjacently and connecting the first and second coils in series inside the spiral inductors forming the first and second transformer coils.

30. The method according to claim 27, wherein forming said spiral inductors comprises forming the spiral inductors on the same surface as on-chip planar microstrip spiral inductors.

\* \* \* \* \*